US006879182B1

(12) United States Patent
Agrawal et al.

(10) Patent No.: US 6,879,182 B1
(45) Date of Patent: Apr. 12, 2005

(54) CPLD WITH MULTI-FUNCTION BLOCKS AND DISTRIBUTED MEMORY

(75) Inventors: Om P. Agrawal, Los Altos, CA (US); Chan-Chi Jason Cheng, Fremont, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/428,889

(22) Filed: May 1, 2003

(51) Int. Cl.[7] ............................................... H03K 17/16
(52) U.S. Cl. .............................. 326/31; 326/30; 326/34; 326/38
(58) Field of Search .............................. 326/30, 31, 27, 326/38, 34, 66

(56) References Cited

U.S. PATENT DOCUMENTS

| | | | |
|---|---|---|---|
| 5,926,033 A | * 7/1999 | Saigo et al. | 326/31 |
| 5,966,027 A | 10/1999 | Kapusta et al. | |
| 6,031,389 A | * 2/2000 | Fotouhi et al. | 326/31 |
| 6,084,426 A | * 7/2000 | Allen | 326/31 |
| 6,184,713 B1 | 2/2001 | Agrawal et al. | |
| 6,191,606 B1 | * 2/2001 | Ye et al. | 326/31 |
| 6,320,408 B1 | * 11/2001 | Kwong | 326/31 |
| 6,335,934 B1 | * 1/2002 | Sakurai et al. | 370/355 |
| 6,396,301 B1 | * 5/2002 | Wallace et al. | 326/31 |
| 6,456,108 B1 | * 9/2002 | Schmied et al. | 326/31 |
| 6,477,606 B1 | * 11/2002 | Kawamura et al. | 326/31 |
| 6,538,466 B1 | * 3/2003 | Lovett | 326/31 |

OTHER PUBLICATIONS ispMACH 5000VG Family, 3.3V In–System Programmable SuperBIG, SuperWIDE High Density PLDs Datasheet, Lattice Semiconductor Corporation, Dec. 2001.
ispXPLD 5000MX Family, 3.3V, 2.5V and 1.8V In–System Programmable eXpanded Programmable Logic Device XPLD Family Datasheet, Lattice Semiconductor Corporation, Mar. 2003.
ispMACH 4000V/B/C/Z Family Data Sheet, Lattice Semiconductor Corporation, 2003, pp. 1–82 Mar. 2003.
U.S. patent application entitled "Multi–Stage Interconnect Architecture For Complex Programmable Logic Devices", given ser. No. 10/428,888, filed on May 1, 2003.
U.S. patent application entitled "Programmable Logic Device With Enhanced Wide And Deep Logic Capability", given ser. No. 10/428,982, filed on May 1, 2003.
U.S. patent application entitled "Cascaded Logic Block Architecture For Complex Programmable Logic Devices", given ser. No. 10/428,885, filed on May 1, 2003.

* cited by examiner

*Primary Examiner*—Michael Tokar
*Assistant Examiner*—Lam T. Mai
(74) *Attorney, Agent, or Firm*—MacPherson Kwok Chen & Heid LLP

(57) ABSTRACT

A programmable device includes a plurality of programmable blocks each associated with a distributed memory block. The programmable blocks may be configured as logic or memory. The addressing circuitry for each distributed memory block may be shared with its associated programmable block or may be separate.

20 Claims, 17 Drawing Sheets

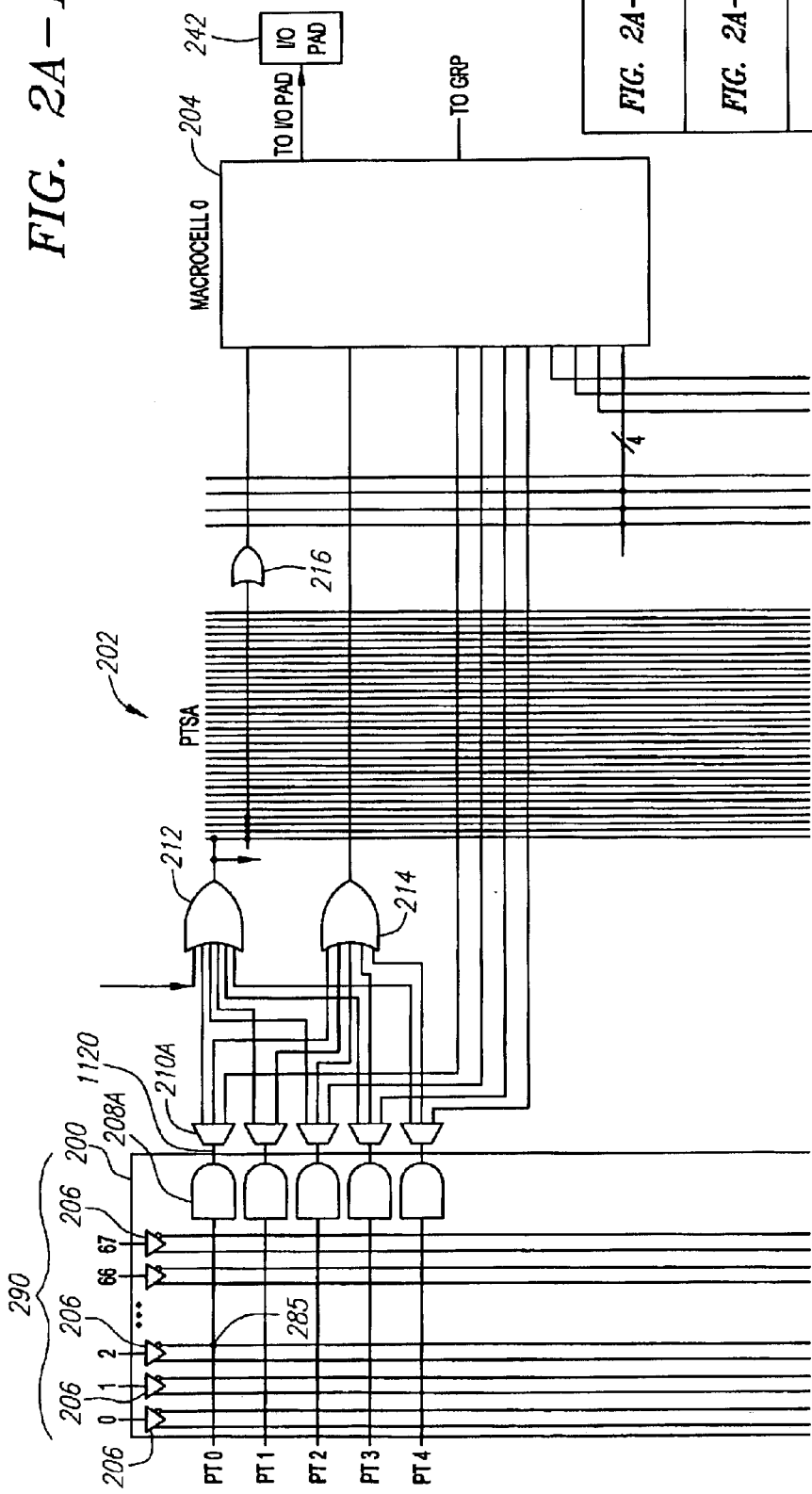

CPLD WITH MULTI-FUNCTION BLOCKS AND DISTRIBUTED MEMORY

TECHNICAL FIELD

The present invention relates generally to memories and programmable devices. Specifically, the present invention relates to programmable logic devices having distributed memory blocks.

BACKGROUND

Complex programmable logic devices (CPLDs), in contrast to field programmable gate arrays (FGPAs), use programmable AND arrays and macrocells to form sum-of use programmable AND arrays and macrocells to form sum-of-product representations of logical functions desired by a user. In addition, to performing a desired logical function, users of CPLDs may also require memory functions in applications such as ATM cell processing, clock domain buffering, shift registers, finite impulse filter delay lines, or program memory. The amount of memory a user will require depends upon the particular application—some require more memory storage and others require less. Thus, it is desirable to provide CPLDs with flexible memory structures to satisfy the majority of users.

To meet the need for a CPLD having a memory capability configurable according to an individual users needs, co-owned U.S. Ser. No. 10/133,016, (the '016 application) filed Apr. 26, 2002, discloses a programmable logic device having logic blocks that may be reconfigured to perform memory functions. The programmable AND arrays within a CPLD includes fuse points that control whether input signals affect the product term outputs. As disclosed in the '016 application, the fuse points within a programmable AND array may be configured for use as a memory array. The '016 application is hereby incorporated by reference in its entirety. The '016 application claims the benefit of co-owned U.S. Provisional Patent Application No. 60/356,507, entitled "DEVICE AND METHOD WITH GENERIC LOGIC BLOCKS," filed on Feb. 11, 2002.

Although the programmable device disclosed in the '016 application permits a user to reconfigure logic blocks to perform memory functions, the reconfigured logic blocks are no longer available to a user to perform desired logical functions. Should a user implement a shallow and widely distributed memory within such a programmable device, valuable logic resources may be depleted.

Accordingly, there is a need in the art for an improved programmable device architecture providing flexible memory capability.

SUMMARY

One aspect of the invention relates to a programmable device including a routing structure and a plurality of programmable blocks each having a logic mode and a memory mode. Each programmable block includes a programmable AND array formed from a plurality of product term circuits each operable in the logic mode to form a product term of logical inputs received from the routing structure, and wherein fuse points within a subset of the product term circuits are operable in the memory mode to form a fuse point memory block, the fuse point memory block being configured to store data words received from the routing structure. A plurality of distributed memory blocks associates with the plurality of programmable blocks on a one-to-one basis. A data bus is operable to receive the stored data words from the fuse point memory block and to receive data words from external sources. Each distributed memory block is configurable to store data words received from the data bus.

BRIEF DESCRIPTION OF THE DRAWINGS

FIG. 5b illustrates a complex NAND gate in the tiered logic structure of FIG. 5a.

Use of the same reference symbols in different figures indicates similar or identical items.

DETAILED DESCRIPTION

The present invention provides a programmable logic device comprising multi-function logic blocks and distributed memory blocks. Each multi-function logic block includes a plurality of product term circuits that form a programmable AND array. The product term output from each product term circuit is the product (the logical AND function) of one or more logical inputs selected from a set of possible logical inputs. The selection of the logical inputs used to form a product term output depends upon the desired logical function a user wants to implement. Based upon the desired logical function, fuse points within each product term circuit are activated to "fuse in" the required logical inputs. Each fuse point comprises a memory cell such as an SRAM memory cell or an EEPROM memory cell. If the memory cells are volatile, configuration signals may control the activation of the fuse points as is known in the art.

In the present invention, the memory cells controlling the fuse points within each product term circuit may be used for other purposes. For example, if just one input is fused in for a given product term circuit, the logical AND of the corresponding product term output has no effect—the logical AND of a single variable does not change its value. In this fashion, a product term circuit may be used as part of a memory as will be explained in further detail herein. To note the multi-purpose nature of logic blocks comprised of product term circuits each configured such that its fuse points may be used for other purposes, such logic blocks are denoted herein as "multi-function blocks."

Figure 1:
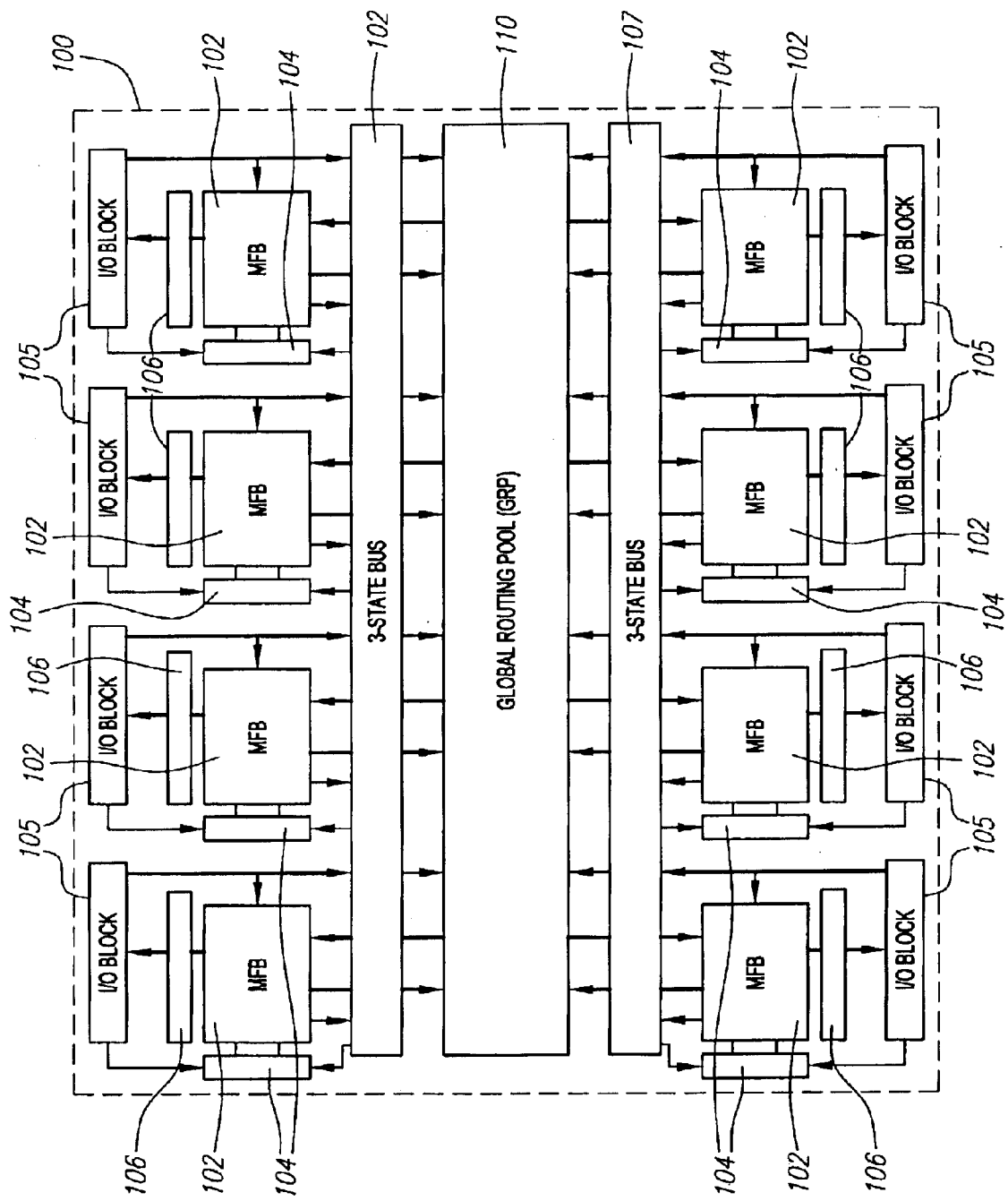
FIG. 1 illustrates one embodiment of a programmable device with a plurality of multi-function blocks and distributed memory blocks according to one embodiment of the invention.

FIG. 1 illustrates one embodiment of a programmable device 100 with a plurality of multi-function blocks 102. Each multi-function block 102 comprises a plurality of product term circuits as will be described further herein. The programmable device 100 may be implemented on a single microchip. There are eight multi-function blocks 102 in FIG. 1, but other embodiments of the programmable device 100 may have any suitable number of multi-function blocks, such as 16, 32, 64, 1000 or 10,000 multi-function blocks. Also, the multi-function blocks 102 may be arranged in a number of different configurations.

The multi-function blocks 102 receive and transmit signals, such as data and control signals, via a routing structure 110 (also known in the art as a routing resource, routing pool, or interconnect structure). The device 100 may also have an isolated, non-volatile memory block (not illustrated), such as EEPROM, that transfers configuration signals and instructions to the multi-function blocks 102 upon power-up if the fuse points comprise volatile memory such as SRAM cells.

Each multi-function block 102 may be associated with a distributed memory block 104 comprised of an array of SRAM cells or other suitable volatile or non-volatile memory cells. Because distributed memory blocks 104 are associated with the multi-function blocks 102, should a user desire to implement a function requiring widely distributed shallow memories, the logic resources provided by multi-function blocks 102 will not be depleted. The logic mode operation for a multi-function block 102 will be described first followed by a description of the memory mode operation.

Logic Mode

Figures 2, 2A:
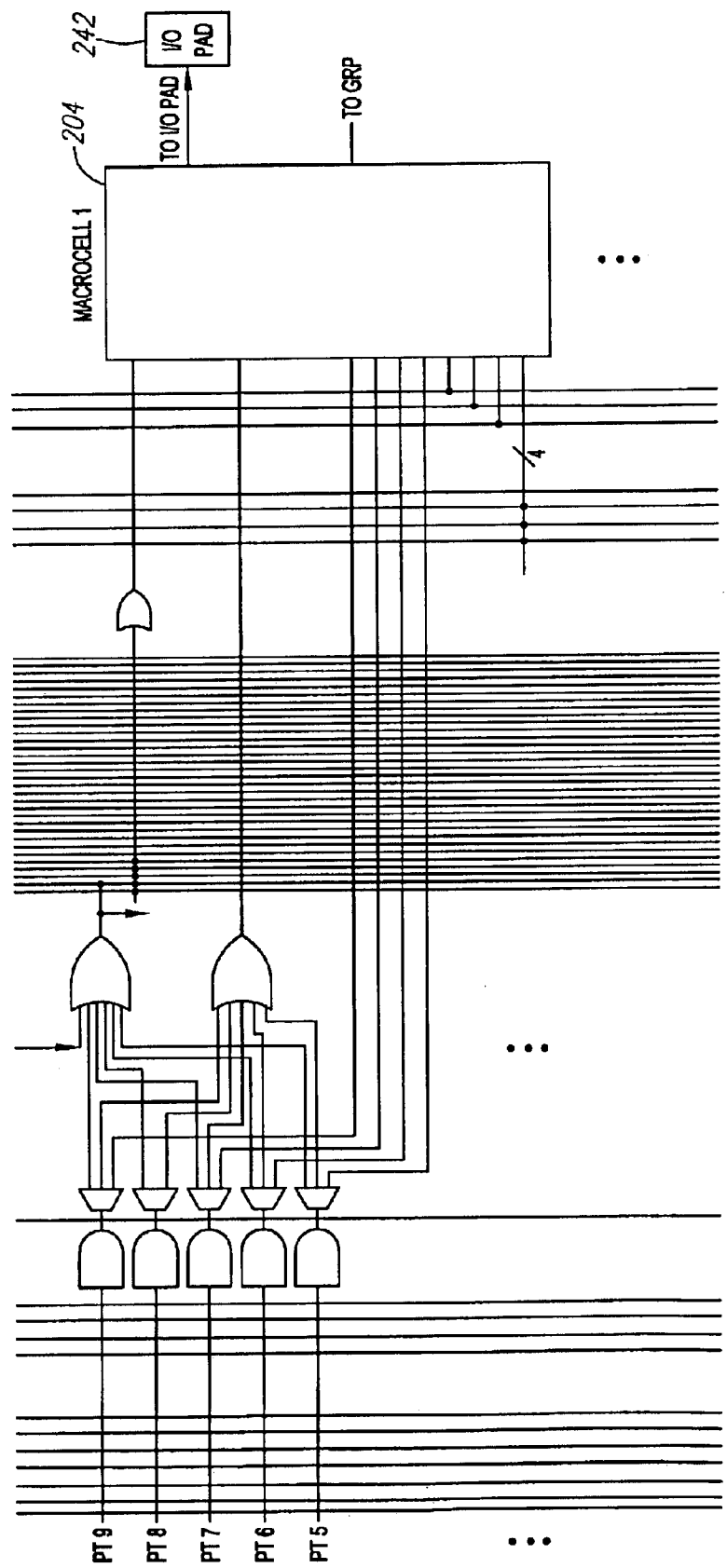
FIG. 2 is a block diagram for a multi-function block of FIG. 1.

FIG. 2 illustrates one embodiment of a multi-function block 102 of FIG. 1. The multi-function block 102 includes a programmable AND array 200 comprising a plurality of product term circuits such as illustrated circuits 208. Although each multi-function block 102 may include any desired number of product term circuits 208, FIG. 2 illustrates an embodiment having 164 product term circuits 208. Each product term circuit may receive sixty-eight logical inputs 290 coupled from routing structure 110 (FIG. 1). However, the actual number of logical inputs 290 coupled into each multi-function block 102 is not important and may be changed in alternative embodiments. Input ports 206 form the true and complement of each logical input 290. Thus, each product term circuit 208 may form the logical AND of up to 136 input variables. From these logical inputs, 164 product term outputs are provided by product term circuits 208, such that each product term output corresponds uniquely to its product term circuit 208. Each product term circuit 208 has fuse points (discussed further below) corresponding to each of the available 136 inputs such that if a fuse point is activated, the corresponding input is selected. Accordingly, each product term circuit 208 includes 136 fuse points for each of its 136 input variables.

Figures 2, 2A, 3:
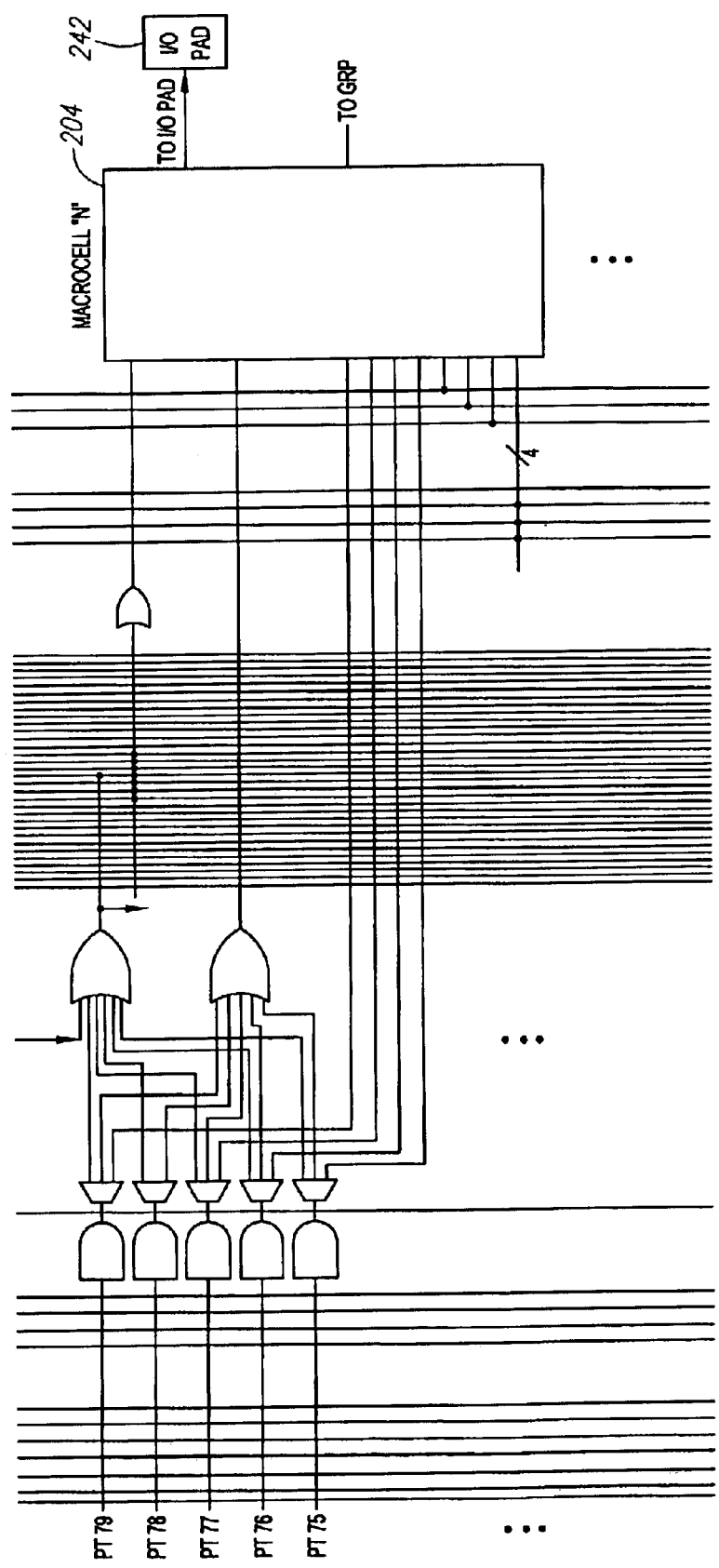
FIG. 3 illustrates one embodiment of an SRAM memory cell that may be used in a product term circuit in the multi-function block of FIG. 2.
Figures 2, 2A, 3, 4:
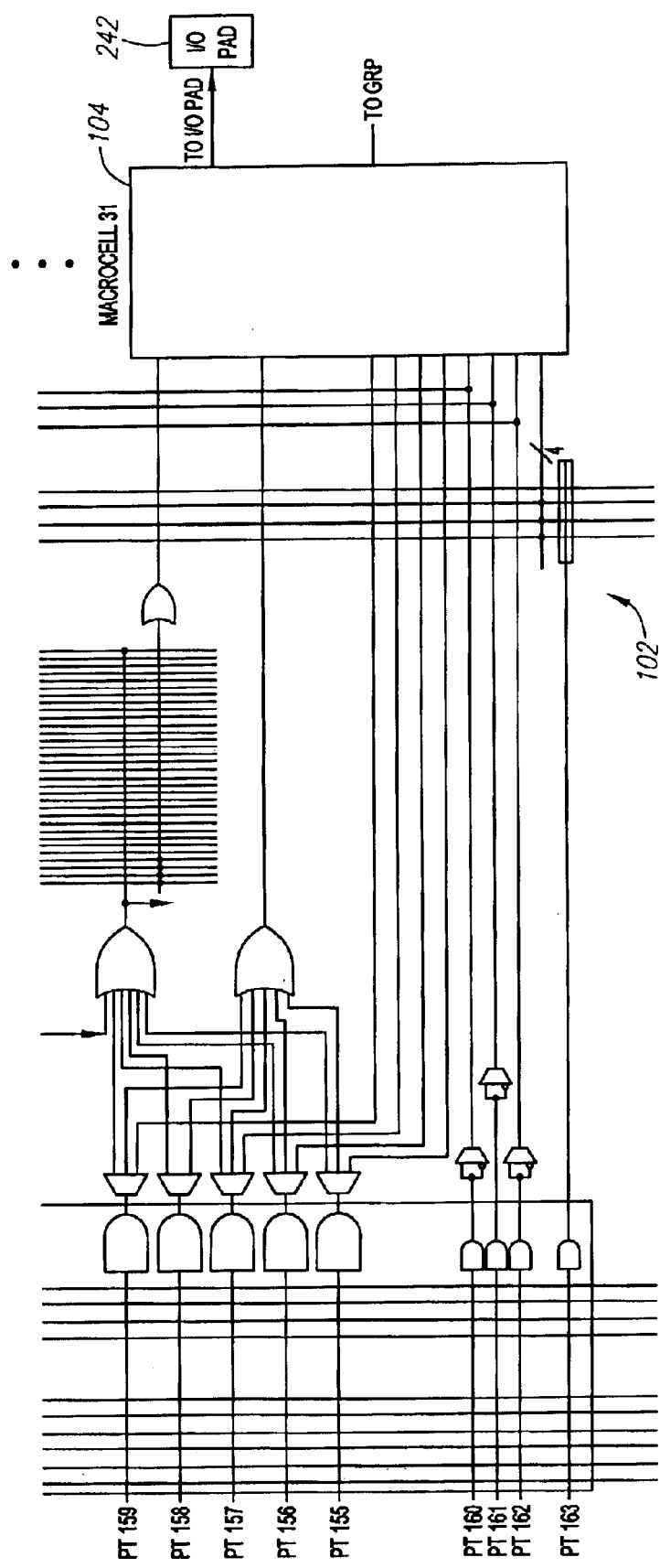
FIG. 4 illustrates one embodiment of a dual-port SRAM cell, which is an enhanced version of the SRAM cell in FIG. 3.
Figure 3:
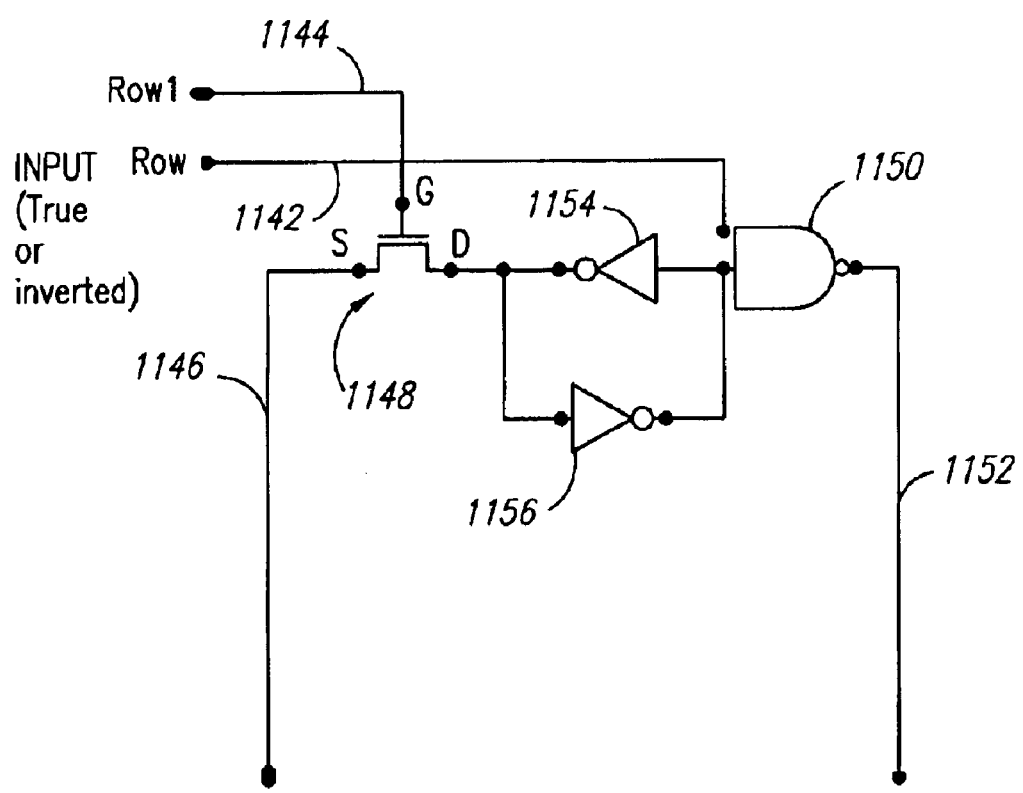
Figure 4:
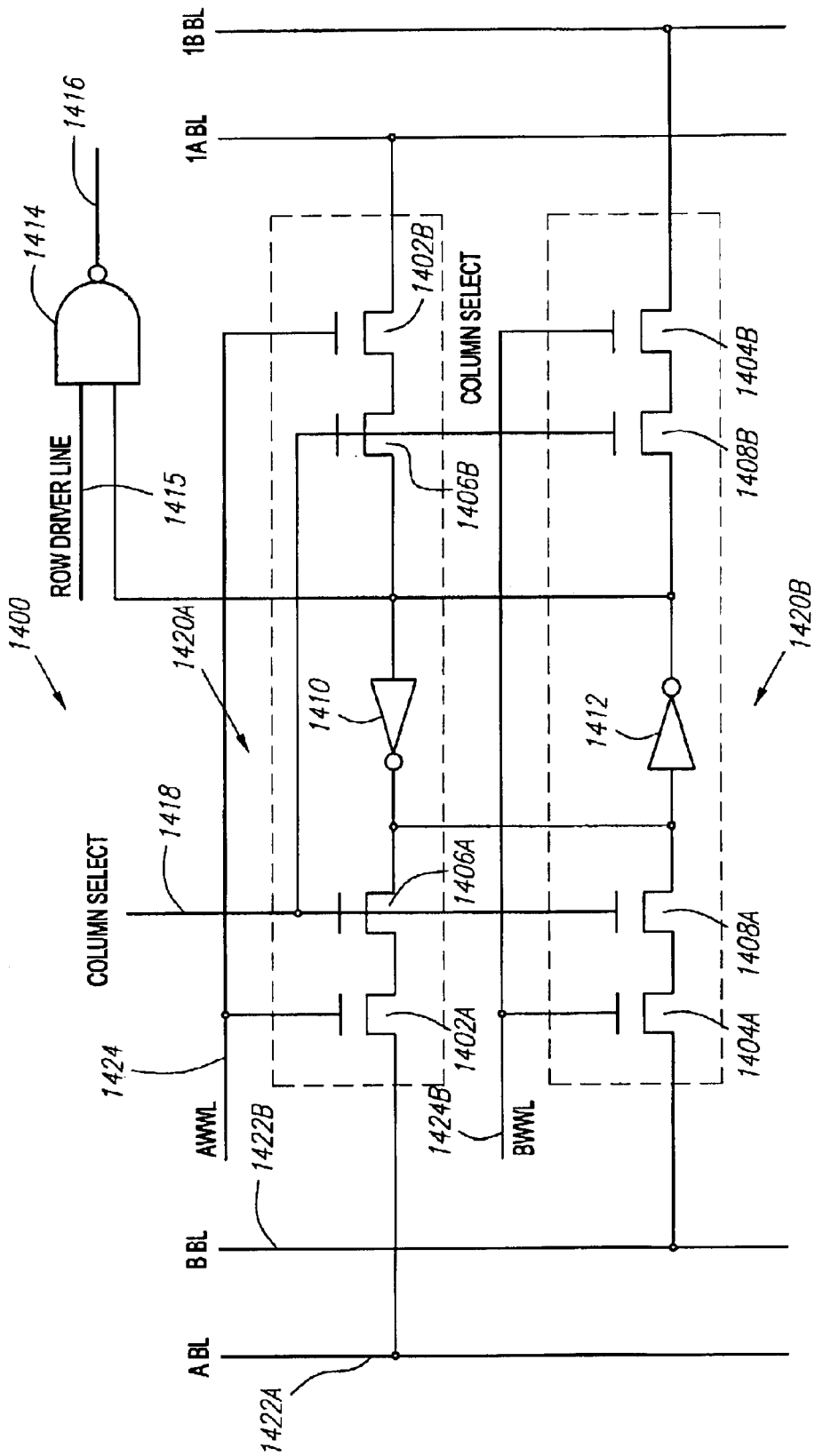

Referring to FIGS. 3 and 4, a variety of SRAM or other type of volatile or non-volatile memory cells may be used to implement the fuse points within each product term circuit. For example, SRAM cell 1140 in FIG. 3 may store a configuration bit using cross-coupled inverters 1156 and 1154. The "Q" output 1141 (which may also be denoted the fuse value 1141) of SRAM cell 1140 is received at NAND gate 1150, which also receives a logical input carried on line 1142. This logical input corresponds to one of the 136 variables coming from input ports 206. If fuse value 1141 is a logical one, NAND gate 1152 passes an inverted version of logical input on output line 1152. In this fashion, the logical input is "fused" onto output line 1152 such that SRAM cell 1140 forms a fuse point that controls whether its corresponding logical input can affect the product term output. Because each product term output is the logical AND of whatever number of logical inputs are fused in (from the possible set of 136 inputs), each product term circuit 208 processes up to 136 logical input variables carried on 136 input lines 1142.

The SRAM cells 1140 for all of the product term circuits 208 may be arranged in rows and columns such that if a given SRAM cell's word line 1144 is held high, SRAM cell 1140 will store the inverse of whatever logical state its bit line 1146 is in. In turn, the activation of the word lines 1144 and bit lines 1146 may be controlled by configuration signals coupled from a non-volatile configuration memory (not illustrated) such as an EEPROM. Should the fuse points be controlled by a dual-write port SRAM cell such as SRAM cell 1420 shown in FIG. 4, column select 1418, dual word lines 1424A and 1424B, dual bit lines 1422A and 1422B, and complement bit lines 1422C and 1422D control the programming of SRAM cells 1420 in a similar fashion as also determined by configuration signals. The EEPROM cells storing the configuration signals may be "zero power" memory cells that consume substantially zero DC current during configuration and erasure as described in (1) U.S. patent application Ser. No. 09/704,487, entitled 'Wide Input Programmable Logic System And Method,' which was filed on Nov. 2, 2000 by the Assignee of the present Application, and (2) U.S. Pat. No. 6,067,252, entitled 'Electrically Erasable Non-Volatile Memory Cell With Virtually No Power Dissipation,' which was filed on May 26, 1999 by the Assignee of the present Application. It will be appreciated, however, that other types of non-volatile memory cells such as conventional EEPROM cells may also be used with the present invention.

Figures 1, 5A:
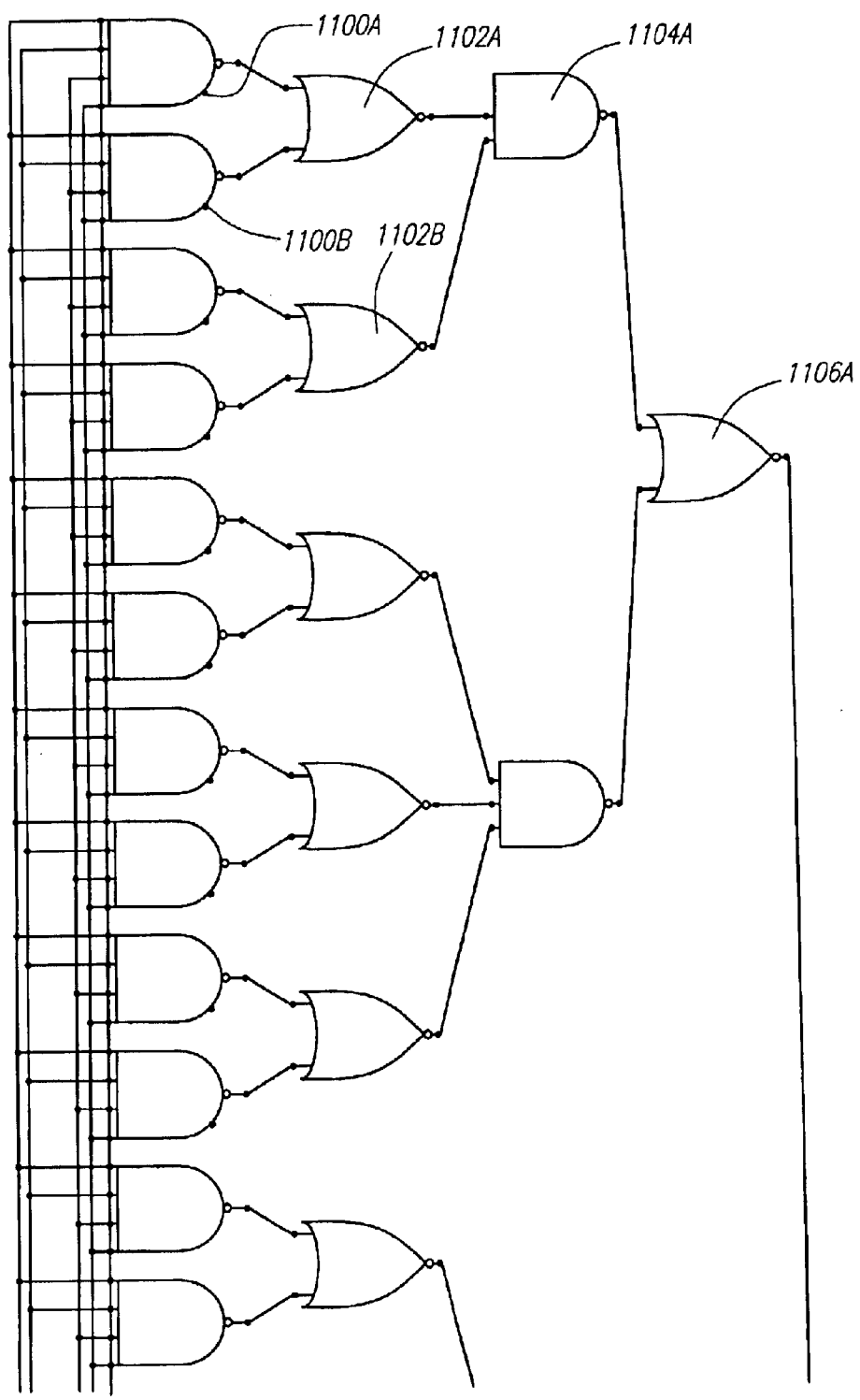
FIG. 5a illustrates one embodiment of tiered logic structure for use in a product term circuit in the programmable logic block of FIG. 2.
Figures 2, 5A:
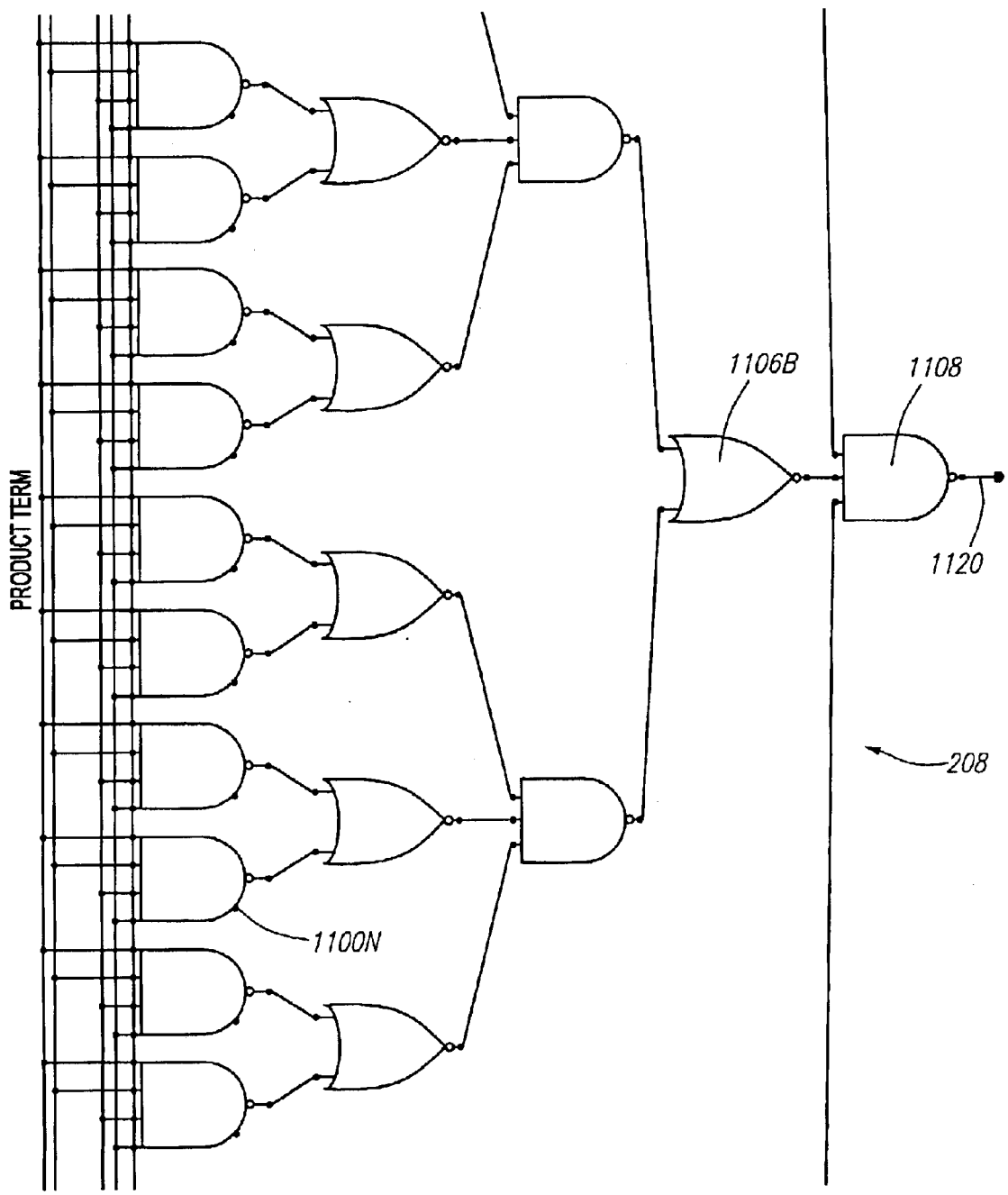
Figures 3, 5A, 5B:
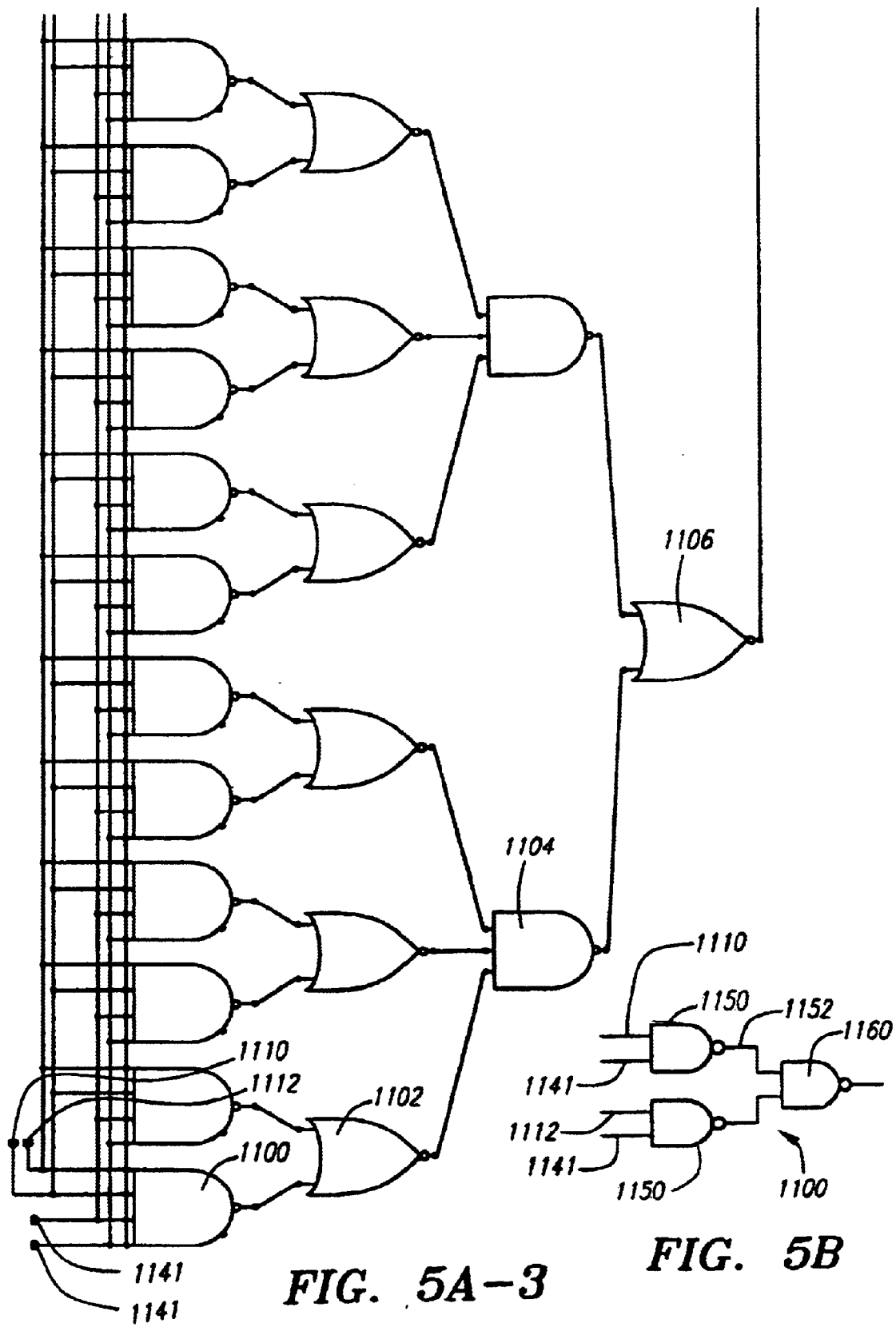

Once all the applicable logical variables have been fused in for a given product term circuit 208, the corresponding product term output may be formed using a sense amplifier as is known in the art. Alternatively, a tiered logic structure such as described in U.S. patent application Ser. No. 09/704,487 may be used to form the product term output. FIG. 5a illustrates one embodiment of a tiered logic structure 1100 for forming a product term output 1120. Each first level "complex" NAND gate 1100A receives the true 1110 and complement values 1112 of a logical input 290 as produced by an input port 206 of FIG. 2. Similarly, each complex NAND gate 1100A receives the SRAM fuse values (the Q output 1141) corresponding to inputs 1110 and 1112. It will thus be appreciated that complex NAND gate 1100A is illustrated for functional purposes only. To permit the individual fusing of each input 1110 and 1112, complex NAND gate 1100A could be implemented by, for example, two NAND gates 1150 (discussed with respect to FIG. 3) as seen in FIG. 5b, where one NAND gate 1150 corresponds to the true input 1110 and the other corresponds to the complement input 1112. Each NAND gate 1150 also receives the fuse signal 1141 (discussed with respect to FIG. 3) corresponding to the relevant input (either 1110 or 1110). The outputs 1152 from each NAND gate 1150 could then be processed by an NAND gate 1160 to form the output of complex NAND gate 1100A. Note that if an actual (rather than "complex") NAND gate was used in place of complex NAND gate 1100A, individual fusing could not be accomplished because the fuse signal 1141 for the true input 1110 would control whether the complement input 1112 could be fused in and vice versa.

Additional tiers of logic formed by NOR gates 1102A, NAND gates 1104A, NOR gates 1106B, and NAND gate 1108 complete the tiered logic structure 1100. It will be appreciated that these logic gates (as opposed to complex NAND gates 1100A) are conventional logic gates because the fusing has already been accommodated by complex NAND gates 1100A.

It will be appreciated that each product term circuit 208 thus includes the fuse points 285 and the structure necessary to form the AND of whatever inputs are fused in. For example, a product term circuit 208 may include 136 SRAM cells 1140 (the fuse points) to provide 136 inputs on lines 1112, whose logical AND product 1120 is produced by the tiered logic structure 1100 discussed with respect to FIG. 5a. It will also be appreciated that other types of structures may be used to form the AND of the fused-in logical inputs such as a sense amplifier.

Referring back to FIG. 2, a plurality of macrocells 204 may register various sums of product term outputs 1120 from the product term circuits 208. For example, each macrocell 204 may receive the output of an OR gate 214. In turn, each OR gate 214 may form the sum of up to 5 product term outputs 1120 depending upon its configuration. Accordingly, each macrocell 204 corresponds to 5 product term circuits 208. In an embodiment having 32 macrocells 204, there would thus be 160 corresponding product term circuits 208. An additional 4 product term circuits 208 may be used to form control signals for the macrocells 204. To permit the option of processing wider input logic functions, each macrocell 204 may also receive a product term sharing output from a corresponding OR gate 216. In turn, OR gate 216 receives inputs fused in from a product term sharing array 202 that is driven by the outputs of 6 input OR gates 212. Each OR gate 212 may receive the 5 product term outputs discussed with respect to OR gate 214. In addition, OR gates 212 may receive an output from other macrocells 204. In this fashion, each macrocell 204 may register various sum of product term outputs depending upon the depth of the logical function a user wishes to implement. It will be appreciated, however, that the manner each macrocell 204 may register various sum of product outputs is unimportant to the present invention.

Regardless of how each macrocell 204 forms its sum of products output, it is these sum of product outputs that will implement a user's desired logical function. Accordingly, referring back to FIG. 1, the sum of product outputs should be available at the input/output (I/O) blocks 105 associated with each multi-function block 102. An output routing pool 106 associates with each multi-function block 102 to permit the rapid routing of the sum of products outputs from the macrocells 204 to the block's I/O block 105, whereby the sum of products outputs are available for use outside of programmable device 100.

Memory Mode

Referring again to FIG. 2, each programmable AND array 200 includes a plurality of product term circuits 208. Each product term circuit 208 provides an AND of the selected inputs as its product term output. Should only one logical input be fused into a product term circuit 208, the product term output equals the logical input—i.e., the logical AND of a single variable does not change its value. With respect to FIG. 3, if the input line 1142 is held high, it will allow Q output 1141 from SRAM cell 1140 to pass (inverted) through NAND gate 1150. If all remaining fuse points/SRAM cells 1140 in a given product term circuit 208 are de-activated and input line 1142 is held high, the product term output 1120 (FIG. 5a) will depend solely on the contents of the affected SRAM cell 1140. In this fashion, a product term circuit 208 may also be used as a memory, reflecting whatever bit value has been programmed into the relevant SRAM cell 1140 through bit line 1146. By combining multiple numbers of product term outputs, data words may be retrieved from an SRAM array forming the fuse points for a set of product term circuits 208.

Figure 6A:
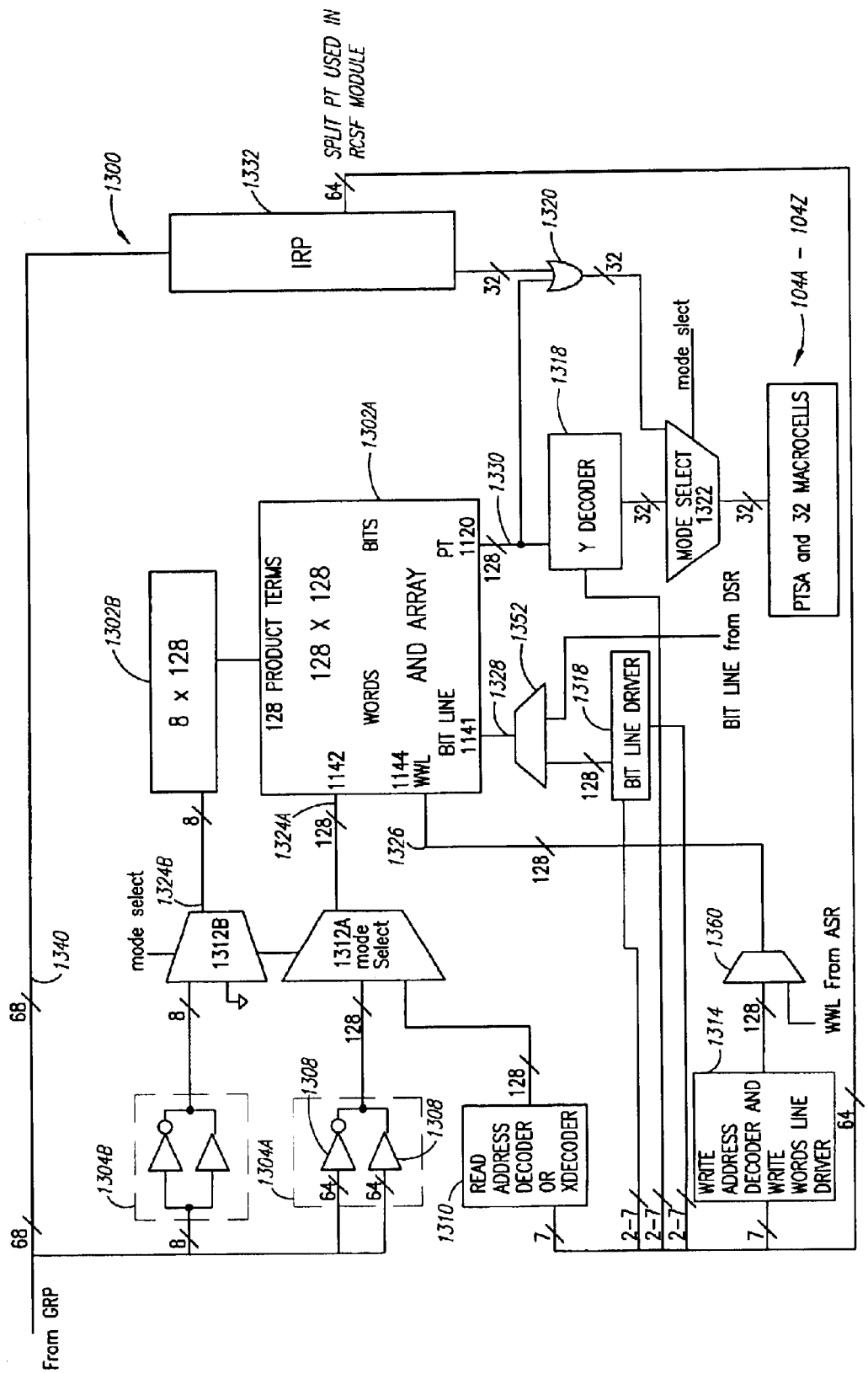
FIG. 6a illustrates a partitioning of the product term circuits in the multi-function block of FIG. 2 to implement a memory according to one embodiment of the invention.

Turning now to FIG. 6a, product term circuits 208 may be divided into an input routing pool (IRP) portion 1332 and a memory portion 1302A. The division is for functional purposes only in that the product term circuit 208 structure discussed with respect to FIG. 2 remains unchanged. For example, IRP portion 1332 may use 32 product term circuits 208 and memory portion 1302A may use 128 product term circuits 208 (out of the total product term circuits 208 contained within programmable AND array 200). As described above, each product term circuit 208 has an SRAM memory cell 1140 corresponding to a possible logic variable that may affect its product term output 1120 (FIGS. 3 and 4). During logic mode, a plurality such as 68 logical inputs 290 may be coupled into each product term circuit 208. Input ports 206 form the true and complement of these logical variables giving a set of input variables twice the size of the set of logical inputs 290 of possible input variables. Each input variable in the set of input variables has a corresponding fuse point/SRAM cell 1140 in its product term circuit 208. Accordingly, if there are 68 logical inputs 290, the number of SRAM cells 1140 in each product term circuit 208 would be 136. Given that memory arrays are much easier to address and decode for if arranged in powers of two, 136 SRAM cells 1140 is an inconvenient number. Thus, memory portion 1302A may include a binary-based subset of SRAM cells such as 128 SRAM cells 1140 from each of its 128 product term circuits 208. Because memory portion 1302A uses the fuse points to form a memory, it may also be denoted as a "fuse point memory block." The remaining 8 SRAM cells from each of the product term circuits 208 in memory portion 1302A may be functionally organized in logic portion 1302B. During logic mode, mode select circuits 1312A and 1312B select the outputs of input ports 206. However, during memory mode, mode select 1312A selects the output of a read address decoder 1310. Read address decoder provides a 128 bit word. This word activates lines 1142 during the reading of a single bit from each relevant product term circuit 208 (those product term circuits 208 each storing a bit of the desired word). It will be appreciated that, depending upon the configurations of the various decoders and associated address circuitry, memory portion 1302A may be used to form a single-port or dual-port RAM, a CAM, or a FIFO memory.

Note that in the logic mode, the order of the logic variables received from routing structure 110 has no effect on the product term output. However, in memory mode, this is not the case—e.g., address bits and data bits are different and must be routed appropriately. Although routing structure 110 could be used to provide the appropriate re-ordering of the address and data signals, such a use would burden routing structure 110. Accordingly, the product term circuits within input routing pool 1332 may be used to perform this re-ordering.

Figure 6B:
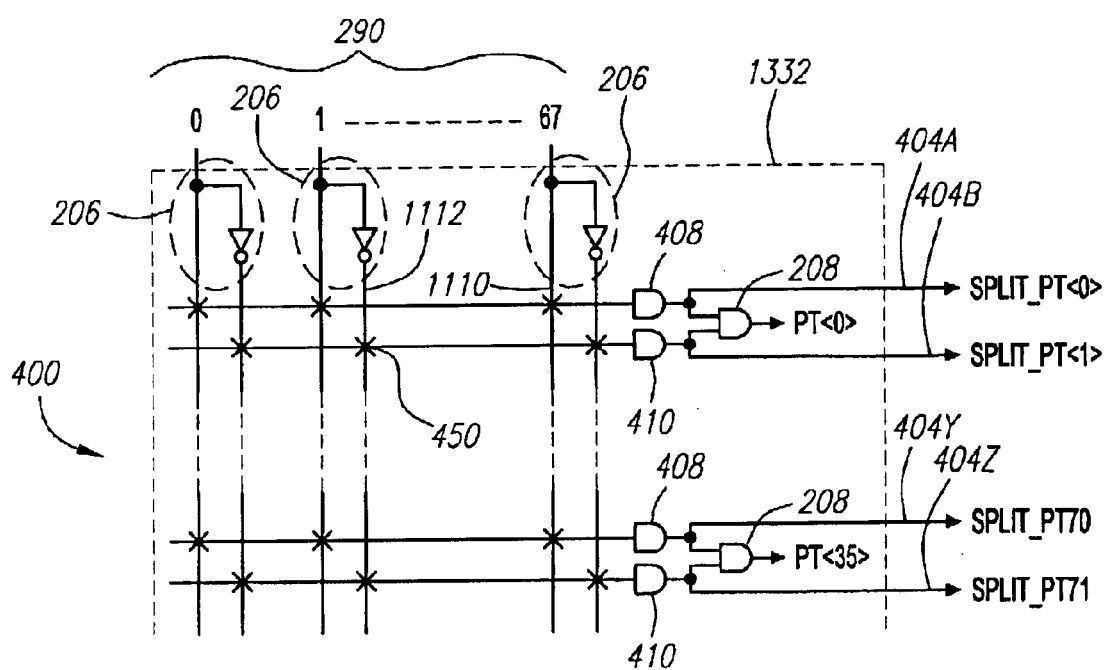
FIG. 6b illustrates the input routing pool formed by the partitioning of the product term circuits shown in FIG. 6a according to one embodiment of the invention.

Each product term circuit 208 within IRP portion 1332 may be "split" to provide split product term outputs 404a and 404b as illustrated in FIG. 6b. Whereas both the true and complement of a logical input 290 may be fused in to affect a product term output as discussed above with respect to FIG. 2, split product term 404A is the logical AND of only the true inputs 1110 (discussed with respect to FIG. 5a) and split product term 404b is the logical AND of the complement logical inputs 1112 (also discussed with respect to FIG. 5a). Just as with the main memory portion 1302A, each split product term 404 from IRP portion 1332 results from the activation of just one fuse point 450 during switch mode operation. Thus, each split product term 404 is the AND of only a single input variable. In this fashion, IRP 1332 may reorder inputs without changing their values. By splitting the product term outputs, the number of product term circuits 208 used to form IRP 1332 is reduced because each product term circuit 208 provides two outputs in a split product term mode. It will be appreciated, however, that the switch mode of the present invention may be practiced without the use of split product terms at the cost of using more product term circuits to perform the input re-ordering function of IRP 1000. Should IRP 1332 contain 36 product term circuits 208, a total of 72 split product terms 404 are available for re-ordering of data and control inputs.

Output Routing Pool

Regardless of whether a multi-function block 102 is programmed to operate in the logic mode or in the memory mode, the structure remains the same. In both modes, the number of macrocells 204 provided to each multi-function block 102 determines the maximum output word width that may be routed to I/O pads 242 (FIG. 2). In turn, each I/O block 105 (FIG. 1) has a fixed number of I/O pads 242. Typically, the number of I/O pads 242 within each I/O block 105 will be less than the number of macrocells 204 within each multi-function block 102. For example, each multi-function block 102 may have thirty-two macrocells 204 whereas each I/O block 105 may have just sixteen I/O pads 242. Thus, in such an embodiment, a multi-function block 102 may provide a 32-bit wide output word from its macrocells 204, regardless of whether it is configured for memory mode or logic mode operation. However, any given I/O block 105 could accommodate only 16 bits of this 32-bits output word. To provide routing of the output word across multiple I/O blocks 105, an output routing pool 106 (FIG. 1) associates with each multi-function block 102. Output routing pool 106 is a switch matrix configured to route the output words as desired by a user (for illustration clarity, output routing pool 106 is not shown in FIG. 2). In this fashion, an output word may be routed across several I/O blocks 105 through output routing pool 106.

Distributed Memory

Should a multi-function block 102 be programmed to operate in the memory mode, its product term circuits 208 are unavailable for logic uses. Accordingly, should a user require shallow and wide memory blocks, the logic resources provided by a plurality of multi-function blocks 102 may become depleted quickly.

A user may prevent such depletion by utilizing the distributed memory blocks 104 illustrated in FIG. 1. While the distributed memory blocks 104 may be formed using any suitable number of memory cells, the memory resources already provided by the multi-function blocks may be used to aid a distributed memory block 104 array size choice. For example, the multi-function block 102 of FIG. 2 may be used as a 16K memory. In such an embodiment, the array size of distributed memory block 104 may be chosen to complement such a 16K memory capability with a smaller size such as 1K or 2K. In this fashion, should a user desire shallow distributed memory, the logic resources will not be depleted. It will be appreciated, however, that the array size of distributed memory block 104 may be varied in other embodiments of the invention.

Once a data word has been stored in a distributed memory block 104, there are several ways in which the stored word may be retrieved. For example, each distributed memory block 104 may be coupled to provide the retrieved data words to routing structure 110. If, however, a distributed memory block 104 is coupled to routing structure 110 in this fashion, routing structure fuse count and routing burdens are increased. Accordingly, each distributed memory block 104 may instead be coupled to the associated output routing pool 106 of the multi-function block 102. The retrieved data word may then be rapidly routed to the I/O block 105 coupled to the output routing pool 106.

Should a user desire to implement deeper or wider memories using a plurality of distributed memory blocks 104, groups of distributed memory blocks 104 may be coupled to a data bus 107. In the following description, data bus 107 will be implemented as a tri-state bus 107, however, it will be appreciated by those of ordinary skill that other types of data buses may also be used. For example, as seen in FIG. 1, distributed memory blocks 104 may be arranged in groups of four such that each distributed memory block 104 within the group shares the tri-state bus 107. In this fashion, a retrieved data word from one distributed memory block 104 may be transferred to another distributed memory block 104 coupled to its tri-state bus 107. In addition, tri-state bus 107 may receive from I/O block 105 an input data word that in turn may be routed to a distributed memory block 104. Tri-state bus 107 can be any desired width. However, one convenient choice for the width of tri-state bus 107 is to match the number of macrocells 204 per multi-function block 102. For example, multi-function block 102 of FIG. 2 includes 32 macrocells 204. Thus, tri-state bus 107 may be 32 bits wide for such an embodiment, enabling a 32 bit word to be transferred between distributed memory blocks 104. The use of tri-state bus 107 not only reduces the routing burden on routing structure 110 but also provides an inherent ordering to the data words it carries. Thus, only the associated address and control bits for each distributed memory block 104 need re-ordering.

Each multi-function block 102 may be associated with a distributed memory block 104 on a one-to-one basis, as shown in FIG. 1. Alternatively, just a subset of the multi-function blocks 102 may each be associated with a distributed memory block 104. As discussed with respect to the memory mode for multi-function block 102, a distributed memory block 104 may receives its address and control signals from routing structure 110. In addition, data signals may be directly coupled to a distributed memory block via tri-state bus 107 from sources outside the programmable device through I/O blocks 105. As also discussed with respect to the memory mode, address/data/control signals need to be ordered correctly. The tri-state bus 107 inherently preserves any necessary order for the data words it carries. In one embodiment of the invention, the associated address and control signals may be re-ordered using the input routing pool portion 1332 of the associated multi-function block 102. Alternatively, a separate switch matrix may be used to perform the re-ordering of all of these signals or just the re-ordering required for the address and control signals. The input routing pool embodiment will be addressed first.

Sharing the Input Routing Pool

Figure 7:
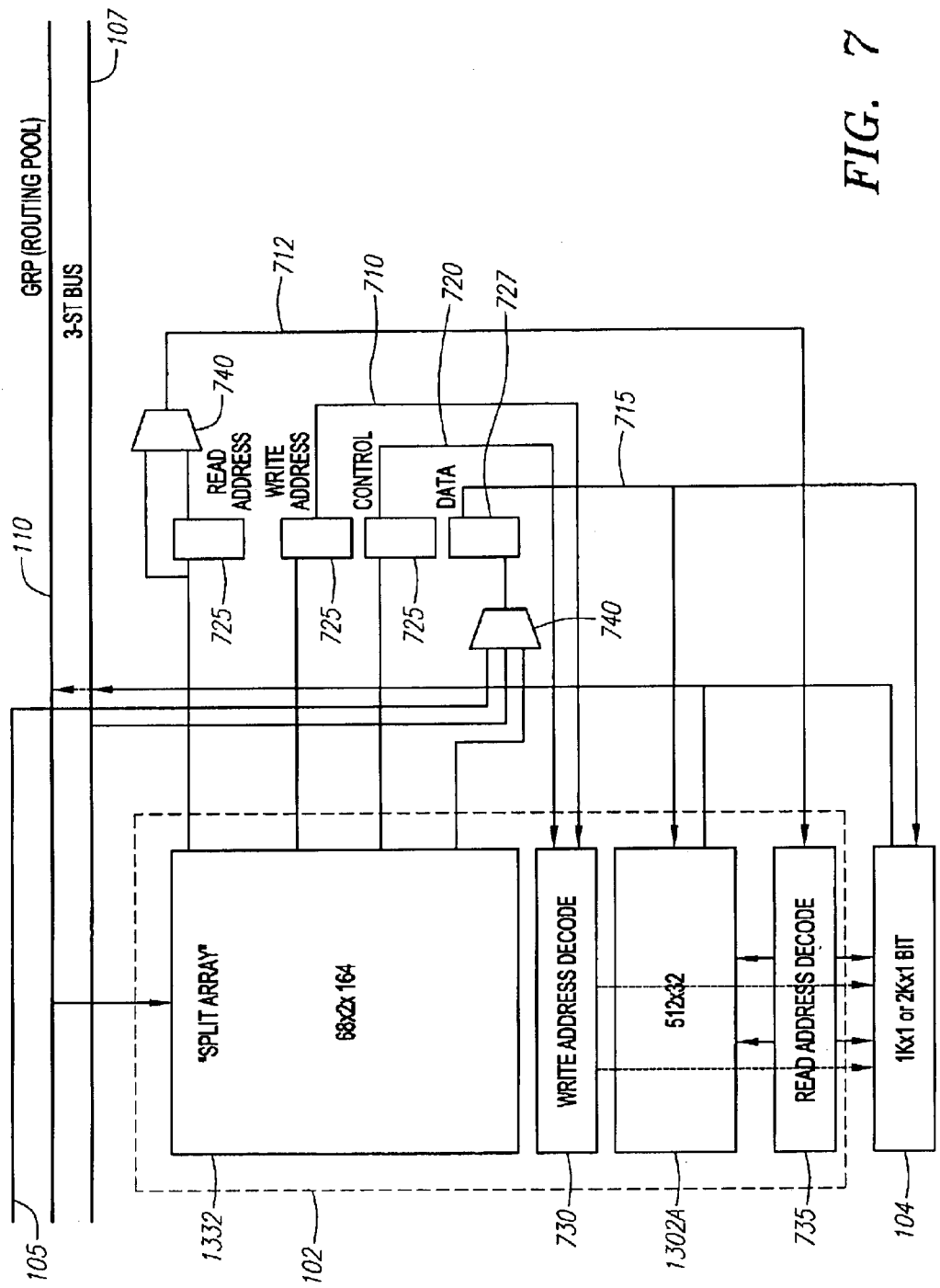
FIG. 7 illustrates an addressing scheme for a memory block of FIG. 1, wherein the memory block shares its address and data ports with the associated multi-function block according to one embodiment of the invention.

Turning now to FIG. 7, a distributed memory block 104 receives its address and control signals (e.g., control signals such as write enable and read enable) from its associated multi-function block's input routing pool 1332. Routing structure 110 provides the input signals to input routing pool 1332 which are re-ordered to form write address signals 710, read address signals 712, and control signals 720. These signals may be registered in registers 725 before their respective coupling to either write address decoder 730, read address decoder 735, memory portion 1302A, or distributed memory block 104. The read address signals 712 may bypass their register 725 through bypass multiplexer 740. Data register 727 may receive data signals from multiple sources through a multiplexer 740. Should multi-function block 102 be configured for memory mode, routing structure 110 provides a data input to input routing pool 1332, where it is re-ordered and routed through multiplexer 740 and data register 727 before it is received by memory portion 1302A as data signal 715. Should data signal 715 be headed for distributed memory block 104, it may be received at multiplexer 740 from either tri-state bus 107 or directly from the appropriate I/O block 105. The same decoders 730 and 735 may be used to address both memory portion 1302A in multi-function block 102 as well as distributed memory block 104. Of course, in such an embodiment, software implementations would have to account for the different ultimate destinations—in other words, an address "A" would map differently within memory portion 1302A than it would within distributed memory block 104. Once a data word has been stored within distributed memory block 104, it may be supplied to an external source via the multi-function block's output routing pool 106 (FIG. 1) and its I/O block 105. Moreover, distributed memory blocks 104 may be cascaded for greater width or depth capability using tri-state bus 107.

Figure 8:
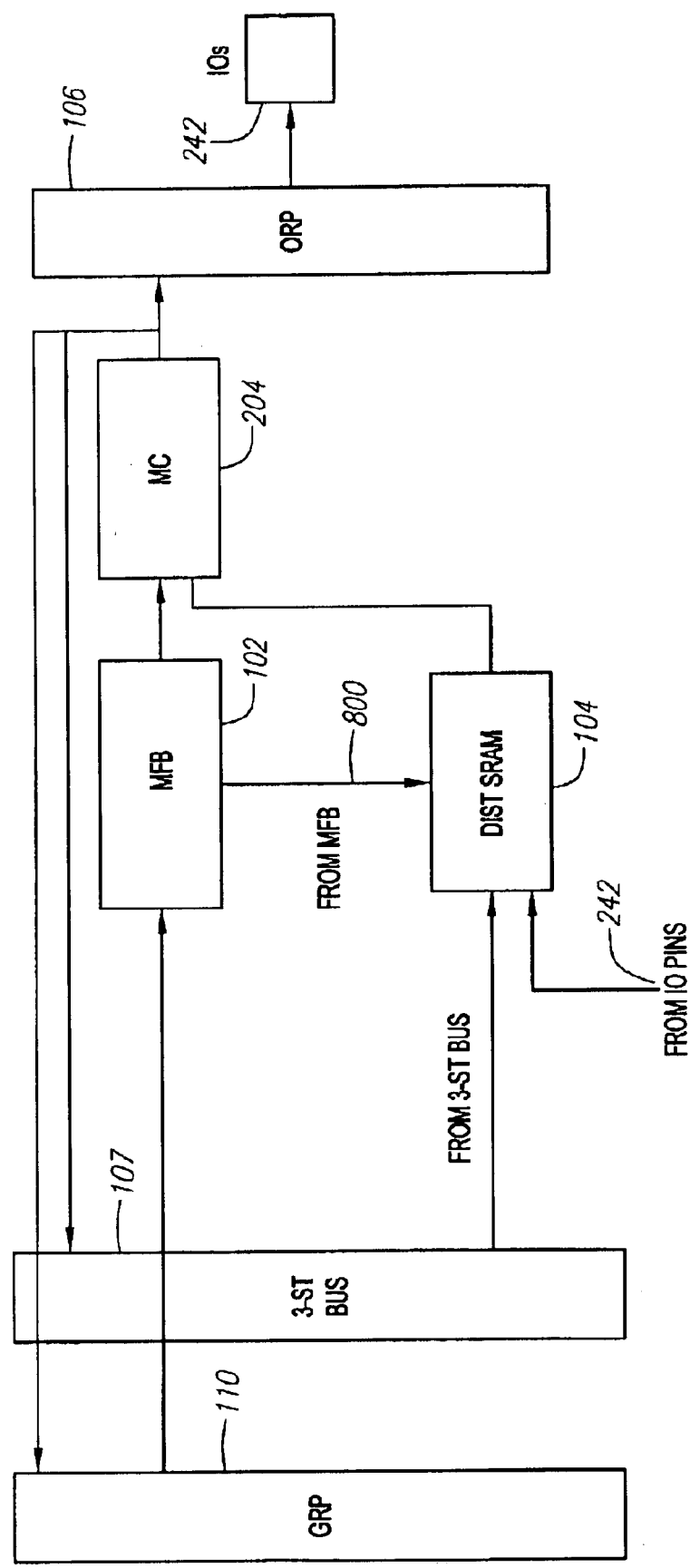
FIG. 8 illustrate the input and output data paths for the memory block of FIG. 7.

As seen in FIG. 8, the input and output data paths for a memory block 104 having the shared addressing scheme discussed with respect to FIG. 7 are illustrated. Distributed memory block 104 may receive data words from either tri-state bus 107 or directly from I/O pins 242. For illustration clarity, signals 710, 712, and 720 discussed with respect to FIG. 7 are grouped together as address and control signals 800. Because of the shared addressing scheme, distributed memory block 104 is not provided with its own output registers. Instead, retrieved data words from distributed memory block 104 are registered in macrocells 204. From the macrocells 204, a retrieved data word from distributed memory block 104 may be routed to routing structure 110 or tri-state bus 107. Multi-function block 102 controls tri-state bus 107 so that data words may be loaded onto tri-state bus 107. Should a user desire the retrieved data word be routed to an external destination, the retrieved data word may also be routed to I/O blocks 105 through output routing pool 106 from macrocells 204.

Although sharing the input routing pool 1332 to provide the re-ordering of address and control signals for both memory portion 1302A and distributed memory block 104 is efficient with respect to reducing the required fuse count, it requires that product term circuits within multi-function block 102 be used to provide the swapping/re-ordering. Thus, these product term circuits are unavailable for use as logic. Accordingly, a user may wish to preserve this logic capacity by providing a separate swap matrix as described in the following embodiment.

Separate Addressing Scheme

Figure 9:
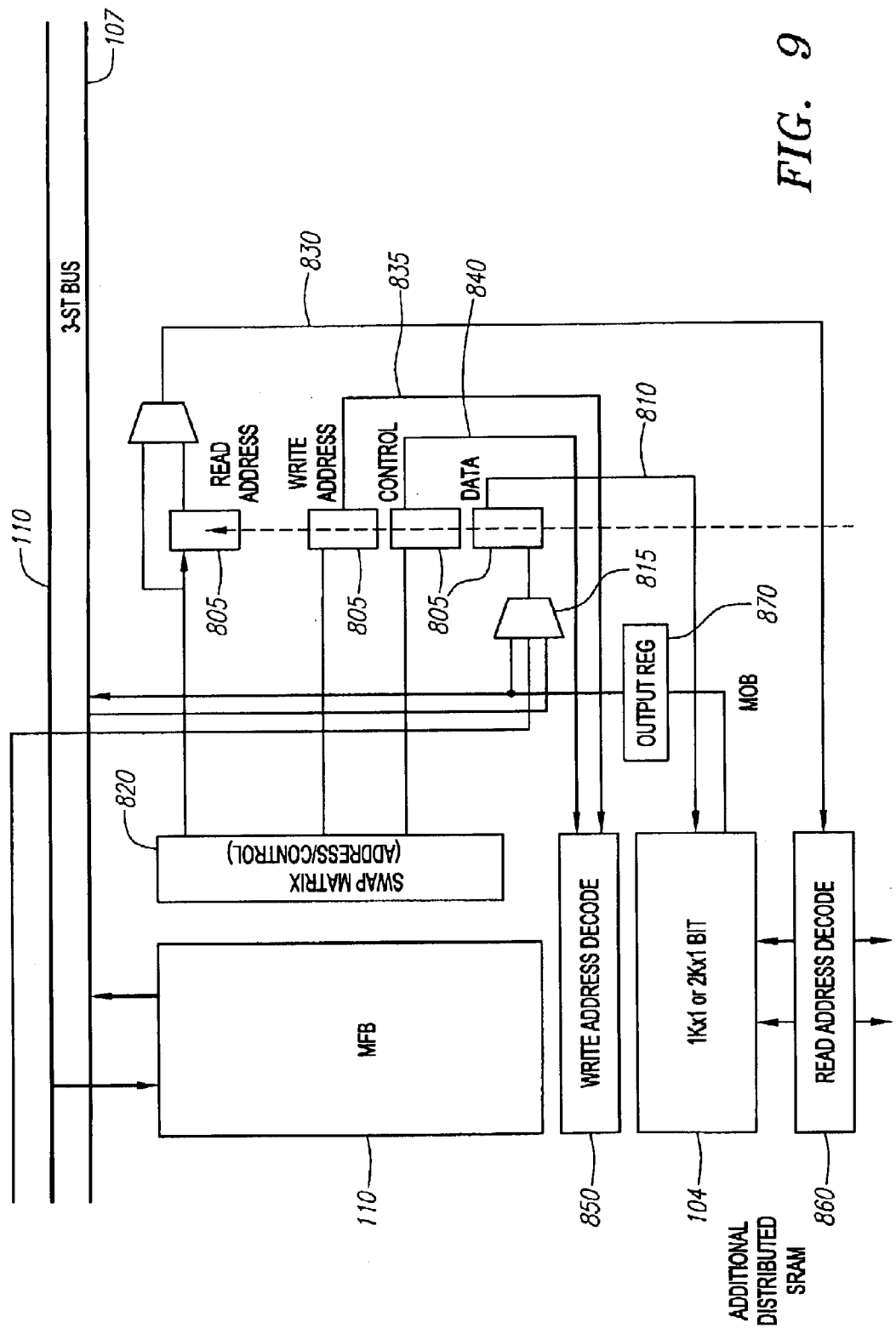
FIG. 9 illustrates an addressing scheme for a memory block of FIG. 1, wherein the memory block has separate address and data ports from the associated multi-function block according to one embodiment of the invention.
Figure 10:
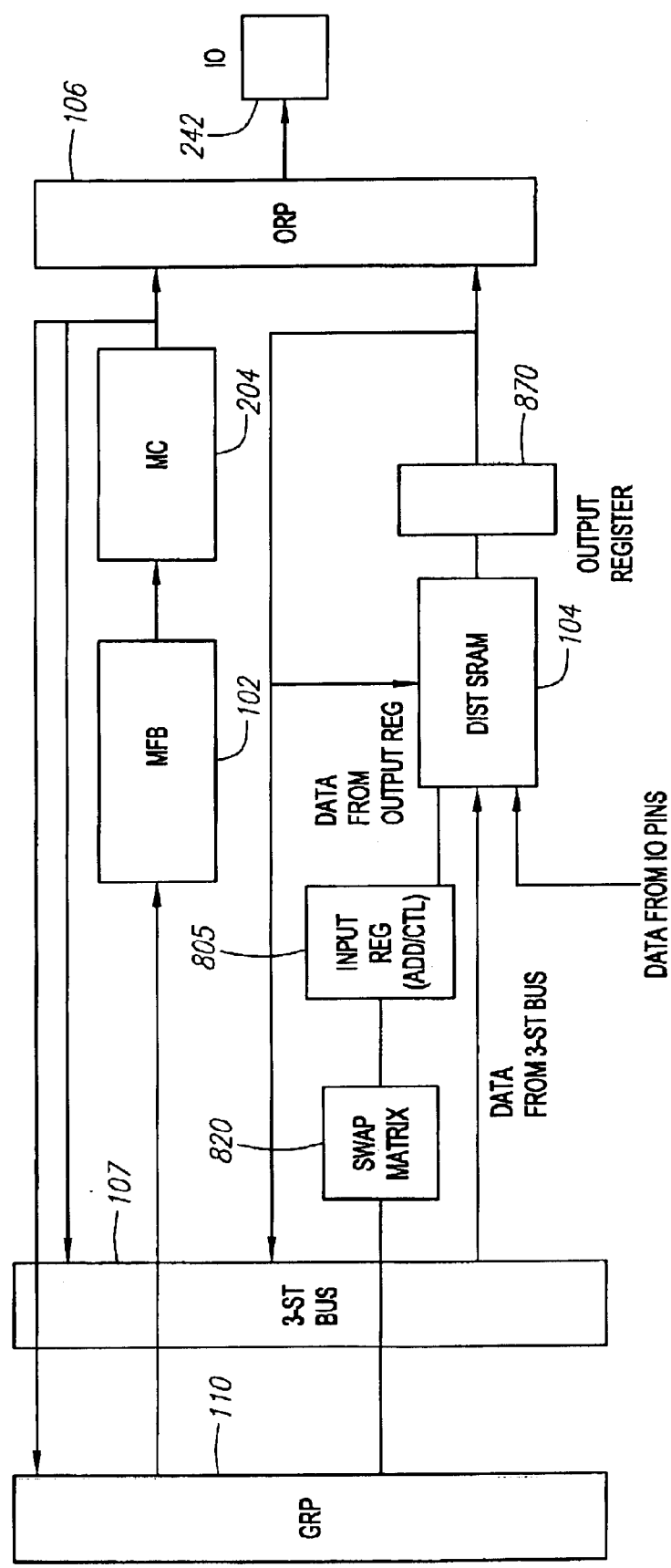
FIG. 10 illustrates the input and output data paths for the memory block of FIG. 9.

Turning now to the embodiment of FIG. 9, a distributed memory block 104 associates with its own address, control, and data registers 805. These registers receive their respective signals separately from the associated multi-function block's input routing pool 1332 (FIG. 6a). The data signals may be supplied by an external source in the correct order. In such a case, they are received at I/O block 105 and routed to multiplexer 815. From multiplexer 815, the data signal may be registered at data register 805 and provided to distributed memory block 104 as data signal 810. Alternatively, bus 107 may provide the data input signal to be selected by multiplexer 815. If received from I/O block 105 or bus 107, the data signals will not need re-ordering. However, the data signals require reordering if provided with the control signals by routing structure. This reordering is provided in the embodiment of FIG. 9 by a swap matrix 820 (comprising either a fully or partially populated switch matrix) that receives control and address signals from routing structure. The re-ordered signals are provided to the respective register 805 to form read address signals 830, write address signals 835, and control signals 840. A write address decoder 850 and a read address decoder 860 receive their respective address signals 835 and 840 so that distributed memory block 104 may be appropriately addressed. Note that the swap matrix 820, although shown separately from routing structure 110, may be integrated within routing structure 110. Data words may be retrieved from distributed memory block 104 after registering in output register 870 via tri-state bus 107 or directly to I/O block 105 via output routing pool 106 (FIG. 1). Note that because output register 870 is not shared with the associated multi-function block 102, the retrieved data signal provided by output register 870 may be feedback through multiplexer 815 to provide an additional data input path for distributed memory block 104. In addition, as seen in FIG. 10, the retrieved data word from output register 870 may couple through output routing pool 106 to I/O blocks 105. Distributed memory block 104 may receive data words from tri-state bus 107 or directly from I/O pins 242 as discussed with respect to FIG. 8. Note that because distributed memory block 104 has its own output register 870, there is no need to use the associated multi-function block's macrocells 204 as an output register. From output register 870, distributed memory block 104 may load a data word onto tri-state bus 107 under the control of the associated multi-function block 102.

Figure 11:
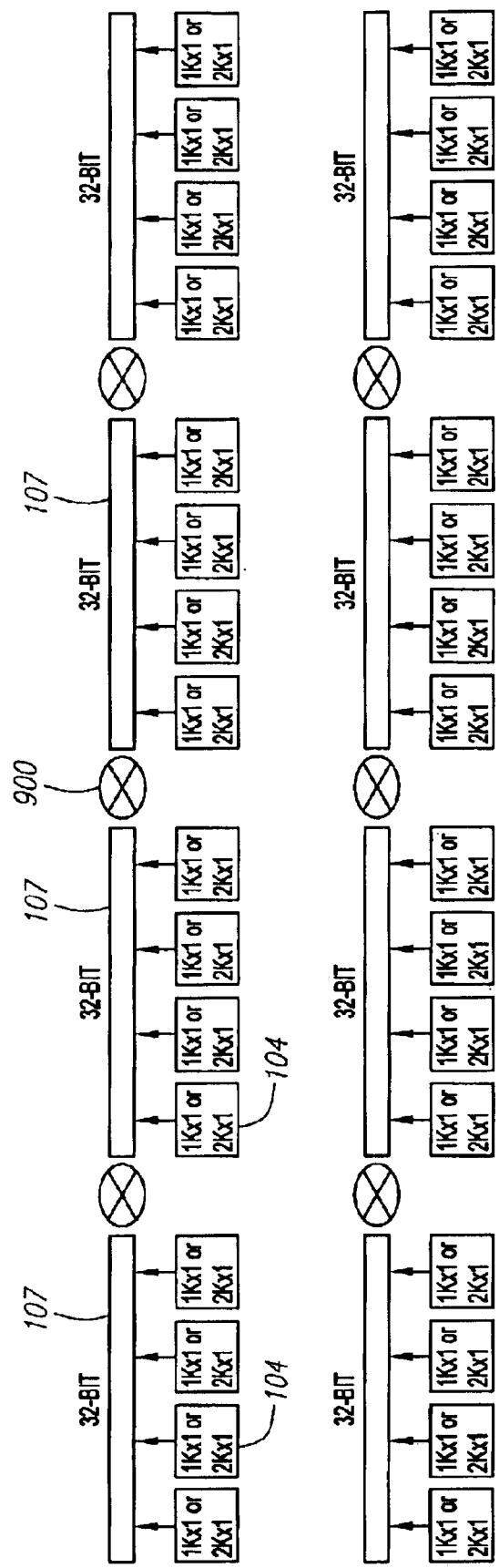
FIG. 11 illustrates a segmented tri-state bus approach for cascading the memory blocks of FIG. 1.

Regardless of whether distributed memory block 104 is implemented to share the addressing scheme with its associated multi-function block 102 or has a separate addressing scheme, a given tri-state bus 107 that spans a group of distributed memory blocks 104 may be joined with other such tri-state buses 107 as seen in FIG. 11 using joiner boxes 900. In this fashion, distributed memory blocks 104 may be cascaded across spanned groups to provide even greater width and depth expansion capabilities.

The above-described embodiments of the present invention are merely meant to be illustrative and not limiting. It will thus be obvious to those skilled in the art that various changes and modifications may be made without departing from this invention in its broader aspects. The appended claims encompass all such changes and modifications as fall within the true spirit and scope of this invention

What is claimed is:

1. A programmable device comprising:
   a routing structure;
   a plurality of programmable blocks having a logic mode and a memory mode, each programmable block including a programmable AND array formed from a plurality of product term circuits operable in the logic mode to form product terms of logical inputs received from the routing structure, and wherein fuse points within a subset of the product term circuits are operable in the memory mode to form a fuse point memory block to store data words received from the routing structure;

a plurality of dedicated memory blocks associated with the plurality of programmable blocks; and a data bus coupled to the programmable blocks and dedicated memory blocks.

2. The programmable device of claim 1, wherein for each programmable block:

a re-ordering subset of the product term circuits are each programmable in the memory mode to select a signal from a set of address signals coupled from the routing structure to provide output signals based upon the selected signal, and wherein the output signals from the re-ordering subset form a re-ordered set of the address signals; and wherein each programmable block further comprises address circuitry configurable to decode the re-ordered address signals and address the associated distributed memory block with the decoded address, whereby the associated distributed memory block may store the data words received from the bus at the decoded address.

3. The programmable device of claim 1, wherein each programmable block further comprises a plurality of N macrocells, wherein each macrocell is configured to register a sum of the product terms, and wherein the bus is N-bits wide.

4. The programmable device of claim 3, wherein N is 32.

5. The programmable device of claim 1, wherein the distributed memory blocks are arranged in groups and the data bus is a tri-state bus, and wherein the tri-state bus is segmented into tri-state bus segments corresponding to the groups such that each tri-state bus segment spans its corresponding group of distributed memory blocks, and wherein the tri-state bus segments may be joined such that the distributed memory blocks may be cascaded through the joined tri-state bus segments.

6. The programmable device of claim 1, wherein each fuse point memory block is configurable as a first-in-first-out (FIFO) memory.

7. The programmable device of claim 1, wherein each fuse point memory block is configurable as a content addressable memory (CAM).

8. The programmable device of claim 1, wherein each distributed memory block is an SRAM array.

9. The programmable device of claim 1, wherein each distributed memory block couples to its own address circuitry, and wherein each distributed memory block's address circuitry is operable to receive re-ordered control and address signals provided by a swap matrix, and wherein each distributed memory block's address circuitry is operable to decode the re-ordered set of control and address signals received from the swap matrix and provide the decoded address to its distributed memory block, whereby the associated distributed memory block may store the data words received from the data bus at the decoded address.

10. The programmable device of claim 9, wherein the distributed memory blocks are arranged in groups and the data bus is a tri-state bus, and wherein the tri-state bus is segmented into tri-state bus segments corresponding to the groups such that each tri-state bus segment spans its corresponding group of distributed memory blocks, and wherein the tri-state bus segments may be joined such that the distributed memory blocks may be cascaded through the joined tri-state bus segments.

11. The programmable device of claim 9, wherein each programmable block includes a plurality of N macrocells, each macrocell being configured to sum a subset of the product terms, and wherein the data bus is N-bits wide.

12. The programmable device of claim 11 wherein N is 32.

13. The programmable device of claim 9, wherein each fuse point memory block is configurable as a first-in-first-out (FIFO) memory.

14. The programmable device of claim 9, wherein each fuse point memory block is configurable as a content addressable memory (CAM).

15. The programmable device of claim 9, wherein each distributed memory block is an SRAM array.

16. A programmable logic device comprising:

a routing structure;

an array of multi-function blocks coupled to the routing structure, each multi-function block including a plurality of macrocells and programmable to operate in a logic mode and a memory mode;

an I/O block associated with each multi-function block;

a dedicated memory block associated with each multi-function block; and a data bus coupled to the multi-function blocks, I/O blocks, and dedicated memory blocks.

17. The programmable logic device of claim 16, wherein each dedicated memory block is configured to receive data words from the data bus.

18. The programmable logic device of claim 16, wherein each dedicated memory block is an SRAM array.

19. The programmable logic device of claim 16, wherein each dedicated memory block is configured to provide retrieved data words to its associated multi-function block's macrocells, and wherein the macrocells are coupled to the data bus.

20. The programmable logic device of claim 19, wherein the data bus is a tri-state bus, and wherein each multi-function block controls whether its macrocells load retrieved data words from the associated dedicated memory blocks onto the tri-state bus.

* * * * *